United States Patent [19]
Lee

[11] Patent Number: 5,953,617
[45] Date of Patent: Sep. 14, 1999

[54] METHOD FOR MANUFACTURING OPTOELECTRONIC INTEGRATED CIRCUITS

[75] Inventor: Joon-Woo Lee, Kyoungki-do, Rep. of Korea

[73] Assignee: Hyundai Electronics Industries Co., Ltd., Kyoungki-do, Rep. of Korea

[21] Appl. No.: 08/951,870

[22] Filed: Oct. 17, 1997

[30] Foreign Application Priority Data

Oct. 19, 1996 [KR] Rep. of Korea ................ 96-47014

[51] Int. Cl.⁶ ................................................ H01L 21/70
[52] U.S. Cl. ........................ 438/329; 438/93; 438/94; 438/312; 438/314; 385/14
[58] Field of Search .................... 438/93, 94, 312, 438/314, 319, 329; 385/14

[56] References Cited

U.S. PATENT DOCUMENTS

| | | |
|---|---|---|
| 5,296,698 | 3/1994 | Tatoh . |
| 5,446,751 | 8/1995 | Wake . |
| 5,475,256 | 12/1995 | Sawada et al. . |
| 5,577,138 | 11/1996 | Chandrasekhar et al. . |
| 5,712,504 | 1/1998 | Yano et al. . |

Primary Examiner—Charles Bowers
Assistant Examiner—Keith Christianson
Attorney, Agent, or Firm—Ware, Fressola, Van Der Sluys & Adolphson LLP

[57] ABSTRACT

A method for manufacturing an optoelectronic integrated circuit including a photo diode for transforming light into electric signals, an HBT for amplifying said electric signals from said photo diode, a capacitor, and a resistor is disclosed. An HBT including an emitter, a base, and a collector on a predetermined location of a semiconductor substrate, and a photo diode including an N type metal, non doped layer, and a P type metal are formed. A lower electrode of a capacitor is formed on the semiconductor substrate located in a place separated by a predetermined space from said photo diode. A SiN film is deposited over the surface of the resulting structure of the semiconductor substrate. The above described SiN film is patterned to exist only on the surfaces of the HBT, photo diode, lower electrode, and semiconductor substrate separated from the lower electrode by a predetermined space. Furthermore, a resistor is formed on the SiN film existing on a predetermined surface of the semiconductor substrate.

11 Claims, 4 Drawing Sheets

METHOD FOR MANUFACTURING OPTOELECTRONIC INTEGRATED CIRCUITS

BACKGROUND OF THE INVENTION

1. Field of the Invention

The present invention generally relates to optoelectronic integrated circuits, and more specifically to a manufacturing method for optoelectronic integrated circuits including a photo diode formed on a semiconductor substrate, which transforms light into electric signals, a hetero bipolar junction transistor (hereinafter abbreviated as HBT) which amplifies the electric signals outputted from the photo diode, a capacitor which by-passes electric signals and a resistor which drops the voltage of a received signal, wherein the capacitor and the resistor are passive devices.

2. Description of the Related Art

An optoelectronic integrated circuit, used as an optical receiver in high frequency optical communication systems, generally includes a photo diode which transforms light produced from a light emitting diode into electric signals, an HBT which amplifies the electric signals produced from the photo diodes, and capacitors, resistors, etc.

A manufacturing method for a conventional optoelectronic diode as mentioned above is given below with reference to FIG. 1.

An HBT (h) which includes an emitter, a base, and a collector, and a photo diode(p), which includes a P type electrode and an N type electrode, are formed on selected portions of a semiconductor substrate 101 by a conventional method. The HBT(h) and the photo diode(p) are electrically isolated from each other. Thereafter, a first insulation film 102, for example, a $SiO_2$ film or a SiN film is deposited over the photo diode(p) and the HBT(h) to protect the same.

Afterwards, pad metal patterns 103, 104 are formed on the first insulating film of both sides of the HBT(h) and the photo diode(p) respectively utilizing the conventional lift off method. In the above process, a lower electrode 105 for a capacitor is also formed on the first insulation film 102. The lower electrode 105 is adjacent to the photo diode(p), and is separated by a selected distance from the photo diode(p).

A second insulation film 106, a dielectric film for the capacitor, for example a SiN film, is deposited over the above described resulting structure. The second insulation film 106 is then etched so that it exists only on top of the lower electrode 105. Afterwards, an upper electrode 107 is formed on top of the lower electrode 105 using a conventional method so as to form a capacitor. Continuously, a resistor 108 is formed using a metal film, such as NiCr, on one side (on a different side with respect to the photo diode(p)) of the capacitor.

Afterwards, predetermined parts of the first insulation film 102 are etched so that the emitter electrode of the HBT(h) and the electrodes of the photo diode(p) are exposed. Next, metal wiring 109, 110 are formed. The metal wiring 109 electrically connects the exposed emitter electrode with the pad metal pattern 103 and the metal wiring 110 electrically connects the exposed electrodes of the photo diode(p) with the pad metal pattern 104.

Afterwards, in certain circumstances, the first insulation layer 102 located on top of the photo diode(p), i.e., the optical receiver, is removed. Then a third insulation film (112), such as a SiN film, is formed to reduce the reflective ratio of induced light.

However, the above described conventional method of manufacturing the optoelectronic integrated circuit technology causes problems such as follows.

After the photo diode(p) and the HBT(h) are formed, the steps of forming the protective first insulation film(102), the dielectric second insulation film(106), and the anti-reflective third insulation film(112) are performed. Although the above described insulation films are of similar materials, the number of steps required to form the insulation layers are increased.

Moreover, to form the above described insulation layers in the appropriate locations, three patterning steps are necessary.

The above mentioned problems cause increases in manufacturing time and cost.

SUMMARY OF THE INVENTION

The present invention is presented in order to solve conventional problems as described above, and to provide a manufacturing method for optoelectronic integrated circuits which enable simplification of the manufacturing process.

To accomplish the object of the present invention as described above, a manufacturing method for optoelectronic integrated circuits including a photo diode for transforming light into electric signals, an HBT for amplifying said electric signals from said photo diode, a capacitor, and a resistor. The method includes the steps of: providing a semiconductor substrate; forming an HBT at a predetermined location of said semiconductor substrate, and a photo diode separated from said HBT by a predetermined space; forming a lower electrode for a capacitor at a predetermined location separated from said photo diode; depositing an insulation film so that said insulation film exists only on predetermined surfaces of said HBT, said photo diode, said lower electrode, and said semiconductor substrate separated from said lower electrode; and forming a resistor on the surface of said insulation film located in a location separated by a predetermined space from said lower electrode.

The present invention utilizes a SiN film as the insulation film.

The insulation film formed on the surface of the HBT and on the side surface of the photo diode is employed as a protective film for the HBT and the photo diode. Also, the insulation film formed on the surface of the photo diode is employed as an anti-reflective film. The insulation film formed between the lower and upper electrode is employed as a dielectric film for a capacitor.

The thickness of the insulation film is determined in accordance with the anti-reflective film of the photo diode.

DETAILED DESCRIPTION OF THE INVENTION

In the present invention, optoelectronic integrated circuit manufacturing steps are reduced because the protective film of the HBT and the photo diode, dielectric film of the capacitor, and the anti-reflective film of the photo diode are formed in a single step.

The protective film of the HBT and the photo diode, dielectric film of the capacitor, and the anti-reflective film of the photo diode of an embodiment is comprised of SiN. The SIN film has superior resistance against foreign objects.

Figure 1:
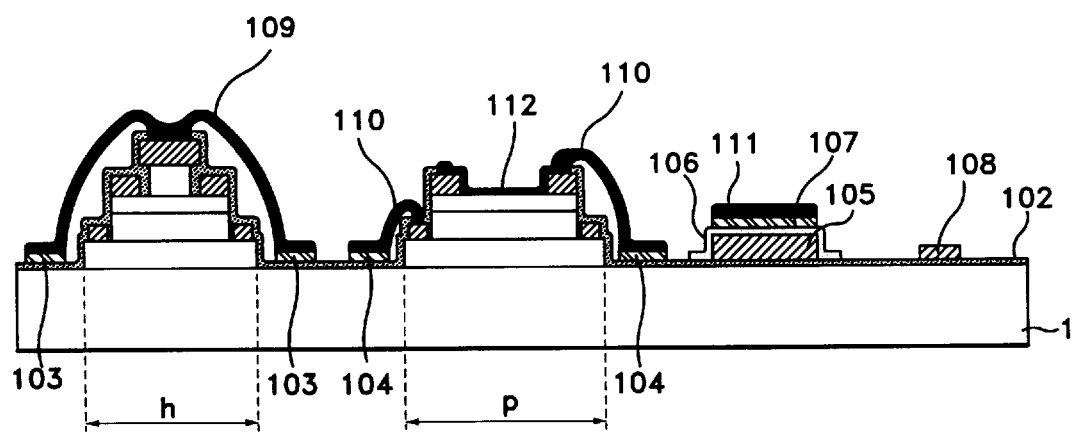
FIG. 1 is a sectional view of an optoelectronic integrated circuit in accordance with a prior art.
Figure 2A:
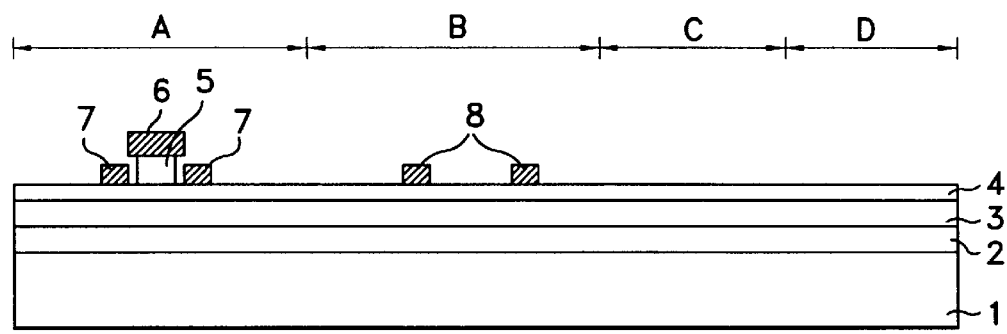
FIG. 2A to FIG. 2F are diagrams to describe the manufacturing method of optoelectronic integrated circuits in accordance with the present invention.

A more specific description is provided with reference to FIG. 2A. First, an n+ type sub collector layer 2, an n type collector layer 3, a base layer 4, and an emitter layer 5 is sequentially grown on a semiconductor substrate 1. In this process, MOCVD (metal organic chemical vapor deposition) or electron beam evaporation method can be utilized. Also, the n+ type sub collector layer 2, n type collector layer 3, base layer 4, and emitter layer 5 are composite layers having a III–V group, a II–IV group or a double hetero junction. Although the usage of the composite layers 2, 3, 4 are restricted to HBT, the n+ type sub collector layer 2 is employed as an N type junction layer for the photo diode. Also, the n type collector layer 3 is employed as the absorption layer, and the base layer 4 is employed as the p type junction layer for the photo diode respectively. In this process, P+ type InGaAs is preferable for forming the base layer 4.

Next, an emitter electrode 6 is formed in a predetermined area of the emitter layer 5 utilizing the conventional lift off method. Afterwards, the emitter electrode 6 is etched using the emitter electrode 16 as a mask. Next, a base electrode 7 surrounding the patterned emitter layer 5 is formed inside the HBT(A) area utilizing the lift off method. At the same time, a P type electrode 8 is also formed on top of the base layer 4 inside the photo diode area (B). Although it is not apparent in FIG. 2A, the base electrode 7 and the P type electrode 8 are ring-shaped when seen from above. Accordingly, the base electrode 7 and the P type electrode 8 are shown as a pair of patterns separated from each other by a predetermined space.

Figure 2B:
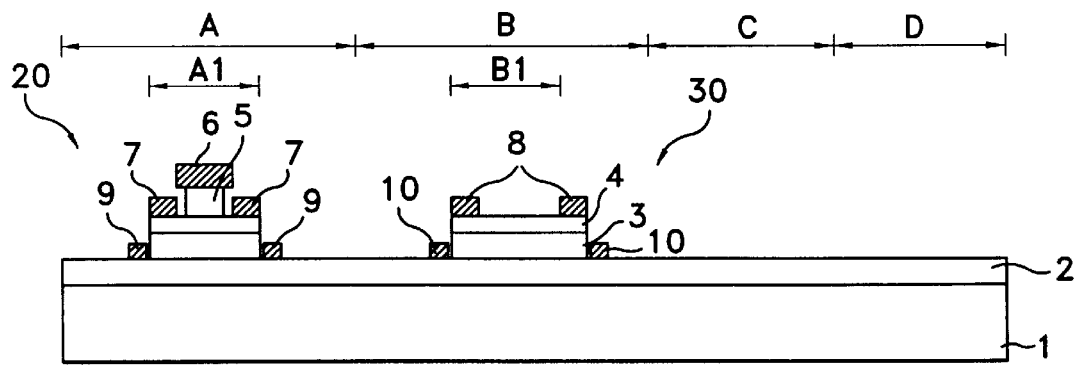

Referring to FIG. 2B, a first resist pattern (not illustrated) is formed to cover the prearranged emitter/base area (A1) of the HBT area (A) and the P type electrode area (B1) of the photo diode area (B). The above described resist pattern is formed utilizing the conventional photo lithography method.

Afterwards, by utilizing the resist pattern (not illustrated), the exposed base layer 4 and the N type collector layer 3 are patterned to form the HBT structure 20 and the photo diode structure 30.

Next, collector electrodes 9 of the HBT are formed on both sides of the HBT structure 20 by utilizing the lift off method. As it is shown, the collector electrode is formed on top of the N+ type sub collector layer 2. At the same time, N type contact metals 10 are formed on both sides of the photo diode structure 30 by utilizing the lift off method.

Afterwards, a second resist pattern (not illustrated) is formed to cover the HBT structure 20 and its collector electrodes 9, and photo diode structure 30 and its N type electrodes 10 by utilizing the photo lithography method. Next, the exposed N+ type sub collector layer 2 is etched in the shape of the second resist pattern forming an HBT 20-1 and a photo diode 30-1. Moreover, the above described etching process will electrically isolate the HBT 20-1 and the photo diode 30-1.

Figure 2C:
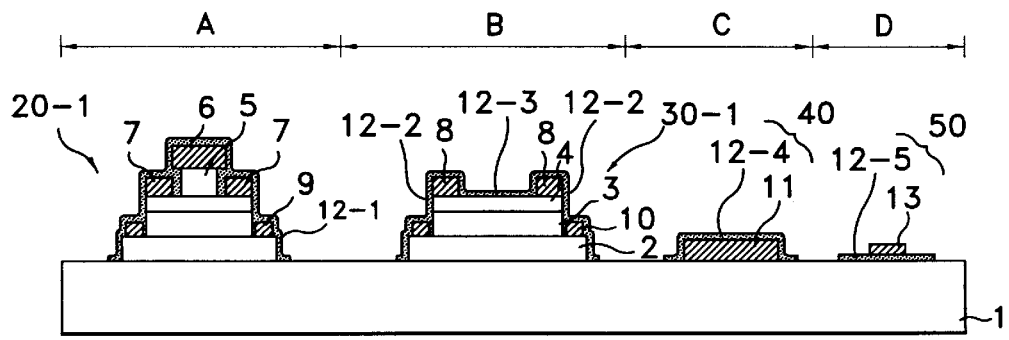

Next, as shown in FIG. 2C, a lower electrode 11 of the capacitor which is one element of the integrated circuit is formed on the predetermined area of the capacitor (C) of the semiconductor substrate 1. In the present embodiment, the predetermined area of the capacitor (C) is located on one side of the photo diode 30-1 as shown in FIG. 2C. Afterwards, an insulation film, for example a SiN film 12, is formed on the entire surface of the resulting structure on the semiconductor substrate 1.

Next, the SiN film 12 is patterned to remain only on the surfaces of the HBT 20-1, photo diode 30-1, lower electrode 11 of the capacitor, and predetermined area of the resistor (D). The SiN film 12-1 on the top surface of the HBT 20-1 is employed as a protective film for the HBT 20-1. The SiN film 12-2 on the side surface of the photo diode 30-1 is employed as a protective film for the photo diode 30-1. Also, the SiN film 12-3 on the top surface of the photo diode 30-1 is employed as an anti-reflective film for the photo diode 30-1. Moreover, the SiN film 12-4 on the upper surface of the lower electrode 11 of the capacitor is employed as a dielectric film for a capacitor. The SiN 12-5 formed in the resistor area (D) is employed as a resistor combined with the metal pattern which will be formed henceforth.

SiN films are used as the insulation film 12 because they are superior in resisting foreign impurities, possess superior anti-reflective characteristics and dielectric characteristics.

On the upper surface of the SiN film 12-5 inside the resistor area (D), a metal pattern 13 such as NiCr is formed to form a resistor 50.

As shown in the above description, the protective layer, anti-reflective film, dielectric film for the capacitor, and the insulation film for the resistor are simultaneously formed in a single deposition-patterning step of the insulation film 12.

The thickness of the above described SiN insulation film 12 is determined in accordance with the anti-reflective film of the photo diode. Also, as the SiN film 12 is employed as a dielectric film for the capacitor, the size of the capacitor electrode is determined by the SiN insulation film 12.

The following table is provided to show the ratio of wave length (X) to transmittance (T) and reflective rate (R) in accordance with the thickness of the SiN insulation film 12.

| SiN thickness [Å] | $\lambda = 1.31\ \mu m$ | | $\lambda = 1.55\ \mu m$ | |
|---|---|---|---|---|
| | Transmittance (T) | Reflective rate (R) | Transmittance (T) | Reflective rate (R) |
| 1500 | 98.2 | 1.8 | 93.7 | 6.3 |
| 1600 | 99.3 | 0.7 | 95.6 | 4.4 |
| 1700 | 99.8 | 0.2 | 97.2 | 2.8 |
| 1800 | 99.6 | 0.4 | 98.5 | 1.5 |
| 1900 | 98.8 | 1.2 | 99.3 | 0.7 |
| 2000 | 97.4 | 2.6 | 99.8 | 0.2 |
| 2100 | 95.5 | 4.5 | 99.7 | 0.3 |
| 2200 | 93.2 | 6.8 | 99.2 | 0.8 |

More specifically, the table presented above shows the minimum reflective rate (R) and transmittance (T) of the incidence light in accordance with the thickness of the SiN film 12-3. The SiN film 12-3 is employed as the anti-reflective film. The incidence light mentioned above is perpendicular to the surface of the photo diode.

As it is apparent in the table, the SiN insulation film 12 possesses its optimal condition, i.e., maximum transmittance and minimum reflective rate, at incidence light wave length of 1.31 $\mu$m and SiN film thickness of 1700 Å, and also at incidence light wave length of 1.55 $\mu$m thickness of 2000Å.

Accordingly, when the optoelectronic integrated circuit is to be used as an optic receiver for incidence light with longer wave length ($\lambda$=1.55 $\mu$m), the optimal thickness for the SiN film is 2000 Å. This thickness is not only typical for an ordinary dielectric for a capacitor, but also thick enough to be employed in a protective film for protecting the surface of the HBT from foreign moisture and dust.

Figure 2D:
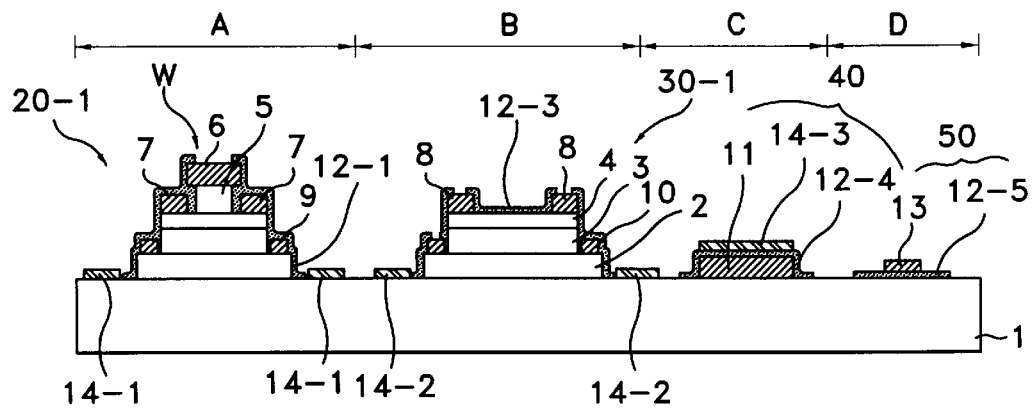

Next, as it is illustrated in FIG. 2D, the SiN film 12 is patterned to expose the underlying emitter electrode 6 of the photo diode 30-1, forming a contact window (W).

Afterwards, pad metal patterns 14-1, 14-2 are formed on both sides of the HBT 20-1 and the photo diode 30-1 respectively by utilizing the lift off method.

An upper electrode 14-3 is formed simultaneously with the above described pad metal patterns 14-1, 14-2 on top of the SiN film 12-4 located inside the capacitor area. The upper electrode 14-3 is also formed by utilizing the lift off method.

Figure 2E:
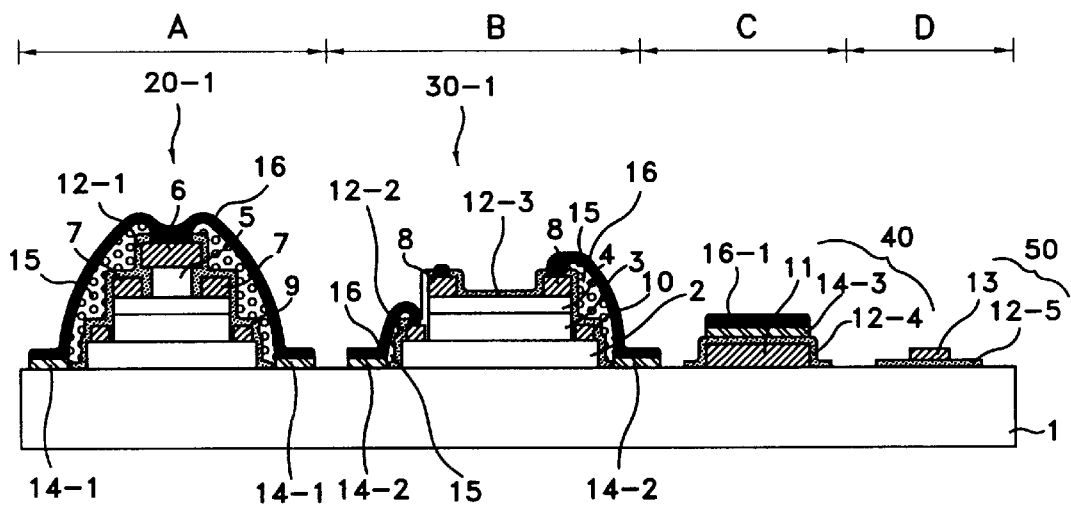

Next, as it is illustrated in FIG. 2E, a third resist is coated over the resulting structure on top of the semiconductor substrate. The third resist is employed to form a metal wiring with an air bridge structure. Afterwards, the third resist is removed from predetermined parts so that the electrode 14-1, 14-2 of the HBT exposed by the contact window (W) and the photo diode, and pad metal patterns 14-1, 14-2 are exposed. The process described above is called the POST process. Also, it is important that the third resist is absent from certain spaces such as in between the semiconductor substrate and the pad metal patterns 14-1, 14-2, on top of the photo diode 30-1, inside the capacitor area (C), and the resistor area (D). Next, on the surfaces of the third resist, and exposed HBT 20-1 and photo diode 30-1, a thin gold film is plated to form a current path (not illustrated). Afterwards, a fourth resist is coated over the resulting structure described so far. The fourth resist then is removed from predetermined parts so that the electrodes 14-1, 14-2 of the HBT exposed by the contact window (W) and the photo diode, and pad metal patterns 14-1, 14-2 are exposed. The fourth resist is utilized as a resist for forming wiring.

Continuously, a metal wiring 16 is formed on the surfaces of the resist 15 and the exposed metal film utilizing the plating method. In this process gold (Au) can be employed. Also on the top surface of the capacitor 40, a metal wiring 16-1 is formed by utilizing the same process used in forming the metal wiring 16.

Figure 2F:
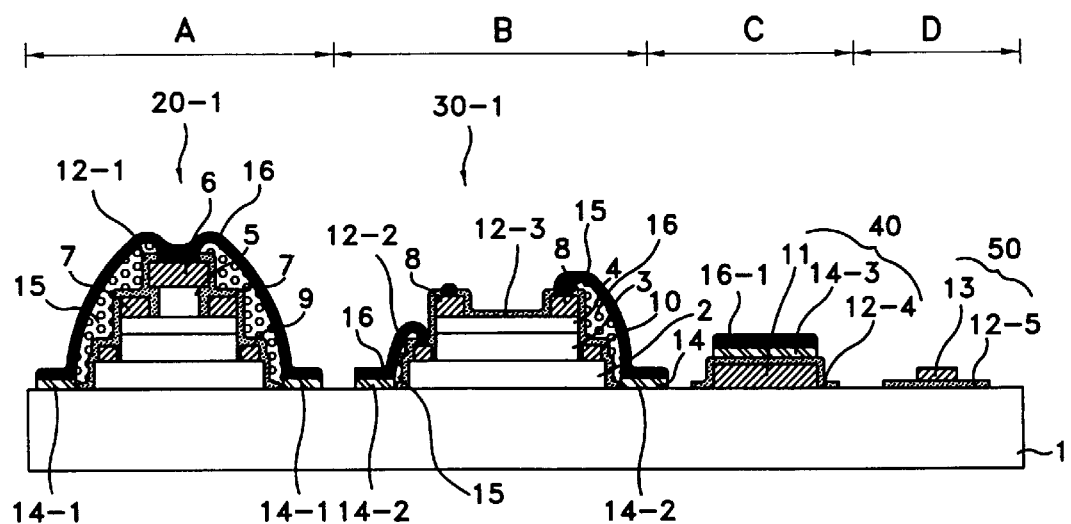

Afterwards, as it is illustrated in FIG. 2F, the third resist, the fourth resist 15, and the thin film gold wiring are selectively removed to create a predetermined space between the metal wiring 16 and the HBT 20-1 and the metal wiring 16 and the photo diode 30-1. The thermal characteristics of the device are enhanced as the metal wiring 16 of the HBT 20-1 is thickened. In the present embodiment of the invention, it is preferable that the thickness of the metal wiring is in the range of 2 to 3 $\mu$m.

Finally, the manufacturing of an optoelectronic integrated circuit with metal wiring is completed.

As it is apparent in the above description, by depositing a SiN insulation film 12 with superior coating characteristics and dielectric characteristics, multiple insulation film forming processes are eliminated. Also, patterning processes to locate the insulation films in appropriate places are reduced, thus simplifying the whole manufacturing process of the optoelectronic integrated circuits.

The present invention is not limited to the above described embodiment.

For example, photo resist method can be employed to form the metal wiring which connects the pad metal patterns 14-1, 14-2 with each electrode 6, 8, 10 instead of the air bridge method employed in the present embodiment.

As it is shown in the given detailed description, the protective film of the HBT and the photo diode, the dielectric film of the capacitor, and the anti-reflective film of the photo diode are formed in a single step of SiN film deposition and patterning.

Accordingly, multiple insulation film forming processes are eliminated. Also, patterning processes to locate the insulation film to predetermined locations can be reduced.

Thus the manufacturing process for optoelectronic integrated circuits is simplified.

Many modifications and variations not departing from the principles and spirit of the present invention would be apparent to those skilled in this art. Accordingly, the attached claims are not limited to the description given above. The claims attached enclose all the inventive and novel modifications and variations according to the present invention.

What is claimed is:

1. A method for manufacturing an optoelectronic integrated circuit including a photo diode for transforming light into electric signals, an HBT for amplifying said electric signals from said photo diode, a capacitor for by-passing electric signals and a resistor for dropping the voltage of a received signal, the method comprising the steps of:

providing a semiconductor substrate;

forming an HBT at a location of said semiconductor substrate, and a photo diode separated from said HBT by a space;

forming a lower electrode for a capacitor at a location separated from said photo diode;

depositing an insulation film so that said insulation film exists only on surfaces of said HBT, said photo diode, said lower electrode, and said semiconductor substrate separated from said lower electrode;

forming a resistor on the surface of said insulation film located in a location separated by a space from said lower electrode; and forming an upper electrode on the insulation film positioned on said lower electrode.

2. The method as claimed in claim 1, wherein said insulation film is a SiN film.

3. The method as claimed in claim 2 wherein said SiN film has a thickness of approximately 1700 Å when the light induced to said photo diode has a wave length of 1.31 $\mu$m.

4. The method as claimed in claim 2 wherein said SiN film has a thickness of approximately 2000 Å when the light induced to said photo diode has a wave length of 1.55 $\mu$m.

5. The method as claimed in claim 1 wherein said step of forming said HBT and said photo diode comprises the steps of:

sequentially growing an N+ type sub collector layer, an N type collector layer, a P type base layer, and an N type emitter layer on top of said semiconductor substrate;

forming an emitter electrode on a part of said emitter layer;

utilizing said emitter electrode as an etching mask and etching said emitter layer to expose said underlying P type base layer;

forming simultaneously base electrodes on both sides of said emitter layer, and P type electrode for said photo diode on a location separated by a space from said emitter electrode, wherein said base electrodes and said P type electrode are formed on said exposed P type base layer;

etching said base layer and said N type collector layer to expose said underlying N+ sub collector layer so that said base layer and said N collector layer remain in a space between said emitter layer and said base electrode, said emitter layer, and said base electrodes, and in a space where said P type electrode and said P type electrode is included;

forming collector electrodes on both sides of said base electrodes simultaneously with N type electrodes on both sides of said P type electrode, wherein said collector electrodes and said N type electrodes are formed on said N+ type sub collector layer;

forming an HBT and a photo diode by patterning the outer surface of said collector electrode and said N+ type sub collector layer which corresponds to the outer surface of said N type electrode respectively.

6. The method as claimed in claim 5 wherein said base layer is of P+ type InGaAs.

7. The method as claimed in claim 1 wherein after the step of forming the upper electrode, the method further comprises the steps of:

forming a contact window by etching said insulation film so that parts of said underlying HBT and said photo diode are exposed;

forming pad metal patterns on said HBT and on said semiconductor substrate exposed on both sides of said photo diode simultaneously with an upper electrode on said lower electrode; and forming a metal wiring so that said pad metal pattern and exposed parts of said HBT and said photo diode are electrically connected.

8. The method as claimed in claim 7 wherein said metal wiring is of Au.

9. The method as claimed in claim 1 wherein said resistor is of NiCr.

10. The method as claimed in claim 1 wherein said insulation film formed on the surface of said HBT and side surfaces of said photo diode is a protective film for said HBT and said photo diode.

11. The method as claimed in claim 1 wherein said insulation film formed on top of said photo diode is an anti-reflective film for said photo diode.

* * * * *

UNITED STATES PATENT AND TRADEMARK OFFICE
CERTIFICATE OF CORRECTION

PATENT NO : 5,953,617
DATED : September 14, 1999
INVENTOR(S): J. Lee

It is certified that error appears in the above-identified patent and that said Letters Patent is hereby corrected as shown below:

At col. 2, line 67, please cancel "SIN" and substitute --SiN-- therefor.

At col. 4, line 27, please cancel "(X)" after "length" and substitute --($\lambda$) therefor; and at line 54, prior to "thickness", please insert --and SiN film--.

Signed and Sealed this

Eighteenth Day of April, 2000

Attest:

Q. TODD DICKINSON

*Attesting Officer*  *Director of Patents and Trademarks*